(12) United States Patent
Ouchi et al.

(10) Patent No.: US 11,356,538 B2
(45) Date of Patent: Jun. 7, 2022

(54) SEMICONDUCTOR MANUFACTURING SYSTEM AND SERVER DEVICE

(71) Applicant: Tokyo Electron Limited, Tokyo (JP)

(72) Inventors: Miki Ouchi, Iwate (JP); Yuichi Fukuchi, Iwate (JP); Masahiro Miya, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 137 days.

(21) Appl. No.: 16/354,336

(22) Filed: Mar. 15, 2019

(65) Prior Publication Data
US 2019/0289099 A1 Sep. 19, 2019

(30) Foreign Application Priority Data

Mar. 16, 2018 (JP) .............................. JP2018-050103

(51) Int. Cl.
| | |
|---|---|
| H01L 21/02 | (2006.01) |
| H04L 67/01 | (2022.01) |
| G05B 19/4155 | (2006.01) |
| H04L 67/06 | (2022.01) |

(52) U.S. Cl.
CPC .......... *H04L 67/42* (2013.01); *G05B 19/4155* (2013.01); *H01L 21/02* (2013.01); *H04L 67/06* (2013.01); *G05B 2219/45031* (2013.01)

(58) Field of Classification Search
None
See application file for complete search history.

(56) References Cited

U.S. PATENT DOCUMENTS

| | | | | |
|---|---|---|---|---|
| 6,460,036 | B1* | 10/2002 | Herz | ................. H04N 21/25891 |
| | | | | 348/E7.071 |
| 9,620,028 | B2* | 4/2017 | Dozier | ..................... G09B 7/08 |
| 2002/0143754 | A1* | 10/2002 | Paulley | ............. G06F 16/24534 |
| 2005/0015258 | A1* | 1/2005 | Somani | ................ G10H 1/0008 |
| | | | | 704/278 |
| 2005/0246211 | A1* | 11/2005 | Kaiser | .................... G06Q 30/02 |
| | | | | 705/7.29 |
| 2005/0273271 | A1* | 12/2005 | Rao | ....................... G06V 20/695 |
| | | | | 702/19 |

(Continued)

FOREIGN PATENT DOCUMENTS

| | | |
|---|---|---|
| JP | 2003-077787 A | 3/2003 |
| JP | 2004-310420 A | 11/2004 |

(Continued)

*Primary Examiner* — Dhairya A Patel
(74) *Attorney, Agent, or Firm* — Abelman, Frayne & Schwab

(57) ABSTRACT

A semiconductor manufacturing system according to an embodiment includes: a controller configured to control a semiconductor manufacturing apparatus; and a server configured to bidirectionally communicate with the controller via a communication line. The server includes a first processor configured to: transmit a backup file creation request (signal) that sets data specific to each controller as a backup file and transmit a backup file acquisition request (signal) requesting acquisition of the created backup file; and receive the created backup file. The controller includes a second processor configured to: receive a request (signal) from the server; and create the backup file when receiving the backup file creation request (signal).

13 Claims, 10 Drawing Sheets

(56) References Cited

U.S. PATENT DOCUMENTS

| | | | |
|---|---|---|---|
| 2006/0015545 A1* | 1/2006 | Ezra | G06F 11/1456 714/E11.12 |
| 2006/0020662 A1* | 1/2006 | Robinson | H04L 51/32 709/203 |
| 2006/0089948 A1* | 4/2006 | Picker | H04N 21/4622 348/E7.071 |
| 2006/0130041 A1* | 6/2006 | Pramanick | G06F 8/61 717/168 |
| 2008/0097980 A1* | 4/2008 | Sullivan | G06Q 30/0246 707/999.005 |
| 2008/0133614 A1* | 6/2008 | Scott | G06F 11/1417 |
| 2011/0055438 A1* | 3/2011 | Nakagawa | G06F 11/0766 710/33 |
| 2012/0080104 A1* | 4/2012 | Yamaguchi | G01F 5/00 137/559 |
| 2013/0014251 A1* | 1/2013 | Nogami | G06F 21/34 726/19 |
| 2014/0025677 A1* | 1/2014 | Asai | G06F 16/13 707/737 |
| 2015/0067398 A1* | 3/2015 | Lee | H04M 1/72412 714/23 |
| 2016/0004717 A1* | 1/2016 | Singhal | G06F 11/1402 707/692 |
| 2016/0328166 A1* | 11/2016 | Nakamura | H04L 67/02 |
| 2016/0350256 A1* | 12/2016 | Basnett | G06F 13/4022 |
| 2018/0138096 A1* | 5/2018 | Koyama | H01L 22/10 |
| 2018/0182653 A1* | 6/2018 | Chong | G06F 11/3684 |
| 2018/0233184 A1* | 8/2018 | Choi | G11C 5/063 |
| 2018/0342429 A1* | 11/2018 | Habets | H01L 22/12 |

FOREIGN PATENT DOCUMENTS

| | | | |
|---|---|---|---|
| JP | 2007158034 A | * | 6/2007 |
| JP | 2009-010030 A | | 1/2009 |
| JP | 2014-011255 A | | 1/2014 |

* cited by examiner

FIG. 4

| PARAMETER | STATUS | RECIPE | SYSTEM SETTING |
|---|---|---|---|
| •DATA RELATED TO APPARATUS CONFIGURATION OR OPERATION<br>•TEACHING DATA RELATED TO TRANSPORT<br>•PROFILE DATA<br>… | •STATE RELATED TO LOAD PORT<br>•SETTING RELATED TO COMMUNICATION WITH AUTOMATIC TRANSPORT MACHINE<br>•DISPLAY SETTING OF TRACE GRAPH<br>… | •RECIPES FOR USE IN PROCESS EXECUTION OR TRANSPORT<br>•MAINTENANCE MACRO<br>… | •OPERATOR<br>•SCREEN OPERATION AUTHORITY SETTING<br>•TCP/IP SETTING<br>•VNC SETTING<br>•ALARM REPORT SETTING<br>•CHARGED OPTION<br>… |

SEMICONDUCTOR MANUFACTURING SYSTEM AND SERVER DEVICE

CROSS-REFERENCE TO RELATED APPLICATIONS

This application is based on and claims priority from Japanese Patent Application No. 2018-050103, filed on Mar. 16, 2018 with the Japan Patent Office, the disclosure of which is incorporated herein in its entirety by reference.

TECHNICAL FIELD

The present disclosure relates to a semiconductor manufacturing system and a server device.

BACKGROUND

In the related art, in a semiconductor manufacturing apparatus that performs various semiconductor manufacturing processes, a predetermined semiconductor manufacturing process is performed by controlling the operation of each unit of the semiconductor manufacturing apparatus by an apparatus controller provided in the semiconductor manufacturing apparatus (see, e.g., Japanese Patent Laid-Open Publication No. 2004-310420). In addition, the apparatus controller includes a storage device for storing, for example, various setting data and backup data used in the semiconductor manufacturing apparatus.

SUMMARY

A semiconductor manufacturing system according to an aspect of the present disclosure includes a controller configured to control a semiconductor manufacturing apparatus, and a server configured to bidirectionally communicate with the controller via a communication line. The server includes a first processor configured to: transmit a backup file creation request (signal) that sets data specific to each controller as a backup file and transmit a backup file acquisition request (signal) requesting acquisition of the created backup file; and receive the created backup file. The controller includes a second processor configured to: receive a request (signal) from the server device; and create the backup file when receiving the backup file creation request (signal).

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a diagram illustrating a specific example of data handled in a semiconductor manufacturing apparatus.

DETAILED DESCRIPTION

Figure 1:
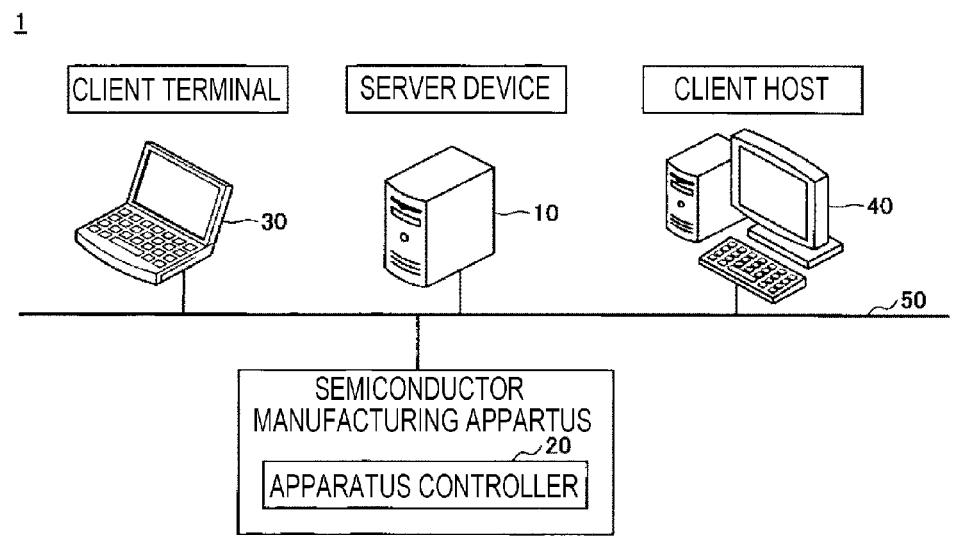
FIG. 1 is a diagram illustrating an example of the overall configuration of a semiconductor manufacturing system according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for carrying out the present disclosure will be described with reference to drawings. Meanwhile, in the specification and drawings, the same reference numerals are used to denote substantially the same components, and redundant descriptions will be omitted.

First Embodiment (Configuration of Semiconductor Manufacturing System)

A configuration of a semiconductor manufacturing apparatus according to a first embodiment will be described. FIG. 1 is a diagram illustrating an example of the overall configuration of a semiconductor manufacturing system according to a first embodiment.

A semiconductor manufacturing system 1 includes a server device 10, an apparatus controller 20 which is a control device mounted in a semiconductor manufacturing apparatus, a client terminal 30, and a customer host 40. The server device 10, the apparatus controller 20, the client terminal 30, and the customer host 40 are connected via a communication line 50 so as to enable bidirectional communication.

The semiconductor manufacturing apparatus is an apparatus that performs various semiconductor manufacturing processes. The semiconductor manufacturing processes includes, for example, a film formation processing, an etching processing, and a heat treatment. The semiconductor manufacturing apparatus may be, for example, a cluster type apparatus in which a plurality of processing chambers (chambers) are arranged around a transport chamber or an in-line type apparatus in which one processing chamber is arranged in one transfer chamber. In addition, the semiconductor manufacturing apparatus may be, for example, a single wafer type apparatus, a semi-batch type apparatus, or a batch type apparatus. The single wafer type processing apparatus is, for example, an apparatus that processes wafers one by one in a processing chamber. The semi-batch type apparatus is, for example, an apparatus in which a plurality of wafers disposed on a rotary table in a processing chamber are revolved by a rotary table to cause the wafers to sequentially pass through a region to which a source gas is supplied and a region to which a reaction gas reactive with a source gas is supplied are sequentially, thereby forming a film on the wafers. The batch type apparatus is, for example, an apparatus in which a wafer boat, which horizontally holds a plurality of wafers at a predetermined interval in a height direction, is accommodated in a processing chamber and a plurality of wafers are processed at a time. In addition, although FIG. 1 illustrates one semiconductor manufacturing apparatus, a plurality of semiconductor manufacturing apparatuses may be used.

(Hardware Configuration of Server Device)

Figure 2:
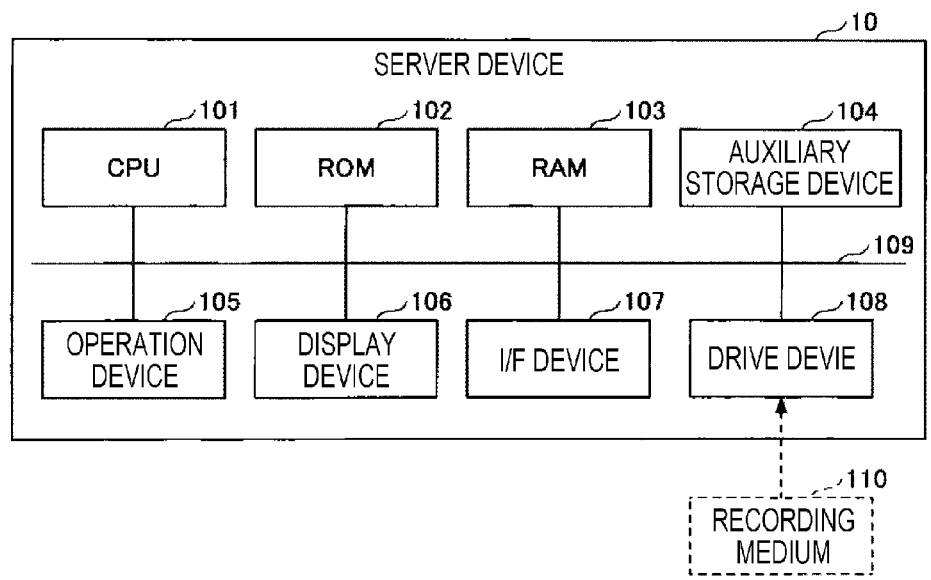
FIG. 2 is a diagram illustrating an example of a hardware configuration of a server device.

A hardware configuration of the server device 10 will be described. FIG. 2 is a diagram illustrating an example of a hardware configuration of a server device.

The server device 10 includes a central processing unit (CPU) 101, a read only memory (ROM) 102, and a random access memory (RAM) 103. The CPU 101, the ROM 102, and the RAM 103 form a so-called computer. In addition, the server device 10 includes an auxiliary storage device 104, an operation device 105, a display device 106, an interface (I/F) device 107, and a drive device 108. The respective hardware components of the server device 10 are connected to each other via a bus 109.

The CPU 101 executes various programs installed in the auxiliary storage device 104.

The ROM 102 is a nonvolatile memory and functions as a main storage device. The ROM 102 stores, for example, various programs and data necessary for the CPU 101 to execute various programs installed in the auxiliary storage device 104.

The RAM 103 is a volatile memory such as a dynamic random access memory (DRAM) or a static random access memory (SRAM) and functions as a main storage device. The RAM 103 provides a work region to be expanded when various programs installed in the auxiliary storage device 104 are executed by the CPU 101.

The auxiliary storage device 104 stores various programs and backup files acquired by executing various programs by the CPU 101.

The operation device 105 is an input device used by a manager of the server device 10 to input various instructions to the server device 10. The display device 106 displays internal information of the server device 10.

The I/F device 107 is a connection device that is connected to the communication line 50 so as to communicate with the apparatus controller 20, the client terminal 30, and the customer host 40.

The drive device 108 is a device for setting a recording medium 110. The recording medium 110 includes a medium that optically, electrically, or magnetically records information, such as, for example, a CD-ROM, a flexible disk, or a magneto-optical disk. In addition, the recording medium 110 may include, for example, a semiconductor memory that electrically records information, such as, for example, a ROM or a flash memory.

The various programs to be installed in the auxiliary storage device 104 may be installed, for example, by setting the distributed recording medium 110 in the drive device 108 and reading out the various programs recorded in the recording medium 110 by the drive device 108. Alternatively, various programs to be installed in the auxiliary storage device 104 may be installed by being downloaded via the communication line 50.

(Functional Configuration of Server Device)

Figure 3:
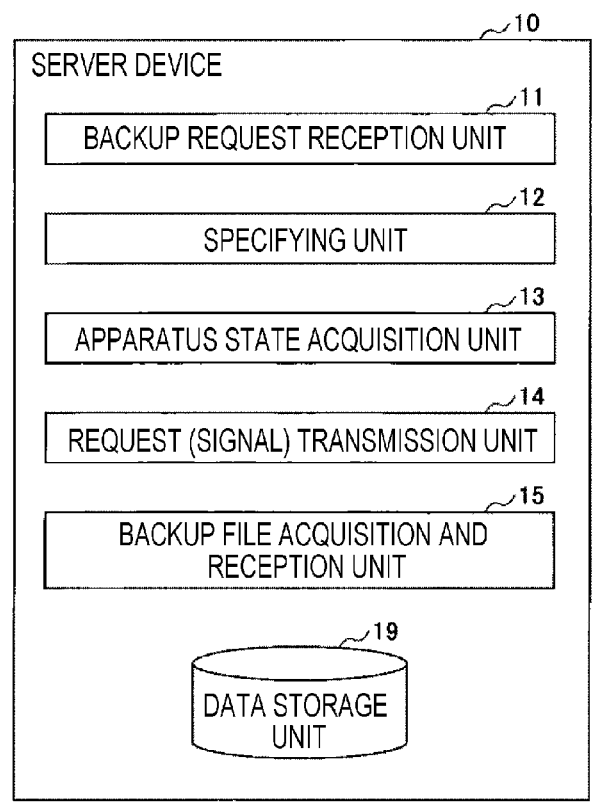
FIG. 3 is a diagram illustrating an example of a functional configuration of the server device.

A functional configuration of the server device 10 will be described. FIG. 3 is a diagram illustrating an example of a functional configuration of the server device 10. FIG. 4 is a diagram illustrating a specific example of data handled in a semiconductor manufacturing apparatus.

The server device 10 includes a backup request reception unit 11, a specifying unit 12, an apparatus state acquisition unit 13, a request (signal) transmission unit 14, a backup file acquisition and reception unit 15, and a data storage unit 19.

The backup request reception unit 11 receives a backup request from the client terminal 30 via the communication line 50. The backup request includes, for example, information (e.g., a device ID) for specifying, for example, a semiconductor manufacturing apparatus on which a backup processing is to be executed, and information for specifying data on which backup is to be executed among data (e.g., a data ID).

Based on the backup request received by the backup request reception unit 11, the specifying unit 12 specifies a semiconductor manufacturing apparatus and data on which backup is executed based on the received backup request. The data includes parameters, a status, a recipe, and system setting as information items. The parameters include, for example, data related to an apparatus configuration and operation, teaching data related to transport, and profile data. The status data includes, for example, a state related to a load port of a semiconductor manufacturing apparatus, setting related to communication with an automatic transport machine that transports a wafer to a semiconductor manufacturing apparatus, and display setting of a trace graph. The recipe data includes, for example, recipes for use in process execution and transport and macros for use in maintenance. The system setting data includes, for example, operator registration setting, screen operation authority setting, TCP/IP setting, virtual network computing (VNC) setting, alarm report setting, and charged option setting. The data illustrated in FIG. 4 is an example, and the types of data included in each information item are not limited to the illustrated ones.

The apparatus state acquisition unit 13 transmits an apparatus state request indicating that the apparatus state of the semiconductor manufacturing apparatus specified by the specifying unit 12 is acquired to the apparatus controller 20 of the semiconductor manufacturing apparatus specified by the specifying unit 12. Further, the apparatus state acquisition unit 13 receives the apparatus state information transmitted from the apparatus controller 20. The apparatus state information includes information indicating, for example, whether the semiconductor manufacturing apparatus is "in operation" or "in non-operation" (e.g., a digital signal). In the case where the semiconductor manufacturing apparatus is a single wafer type apparatus or a batch type apparatus, "in operation" means a state in which the semiconductor manufacturing apparatus is executing a semiconductor manufacturing process, and "in non-operation" means a state other than "in operation." In the case where the semiconductor manufacturing apparatus is a semi-batch type apparatus, "in operation" means a state in which the semiconductor manufacturing apparatus is executing a semiconductor manufacturing process or a state in which a wafer is being transported to the semiconductor manufacturing apparatus, and "in non-operation" means a state other than "in operation."

The request (signal) transmission unit 14 transmits a backup file creation request (signal) requesting creation of a backup file of the data specified by the specifying unit 12 to the apparatus controller 20 of the semiconductor manufacturing apparatus specified by the specifying unit 12. In addition, the request (signal) transmission unit 14 transmits a backup file acquisition request (signal) indicating that acquisition of a backup file of the semiconductor manufacturing apparatus that has transmitted the backup file creation request (signal) is requested to the apparatus controller 20 of the semiconductor manufacturing apparatus specified by the specifying unit 12.

The backup file acquisition and reception unit 15 receives the backup file acquired from the apparatus controller 20, and stores the received backup file in the data storage unit 19.

The data storage unit 19 stores the backup file.

(Hardware Configuration of Apparatus Controller)

Figure 5:
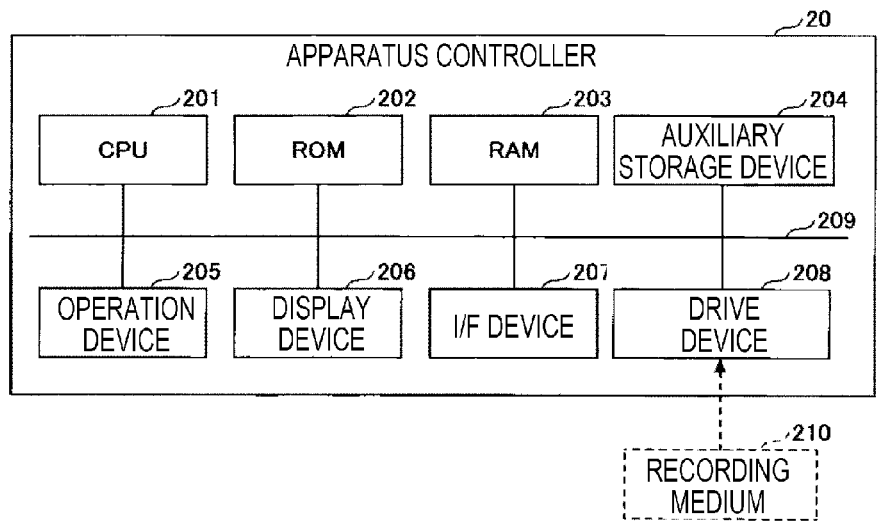
FIG. 5 is a diagram illustrating an example of a hardware configuration of an apparatus controller.

A hardware configuration of the apparatus controller 20 will be described. FIG. 5 is a diagram illustrating an example of a hardware configuration of the apparatus controller 20.

The apparatus controller 20 includes a CPU 201, a ROM 202, and a RAM 203. The CPU 201, the ROM 202, and the RAM 203 form a so-called computer. In addition, the apparatus controller 20 includes an auxiliary storage device 204, an operation device 205, a display device 206, an interface (I/F) device 207, and a drive device 208. The respective hardware components of the apparatus controller 20 are connected to each other via a bus 209. A recording medium is set in the drive device 208.

The CPU 201, the ROM 202, the RAM 203, the auxiliary storage device 204, the operation device 205, the display device 206, the I/F device 207, and the drive device 208 may have the same configurations as those of the server device 10.

(Functional Configuration of Apparatus Controller)

Figure 6:
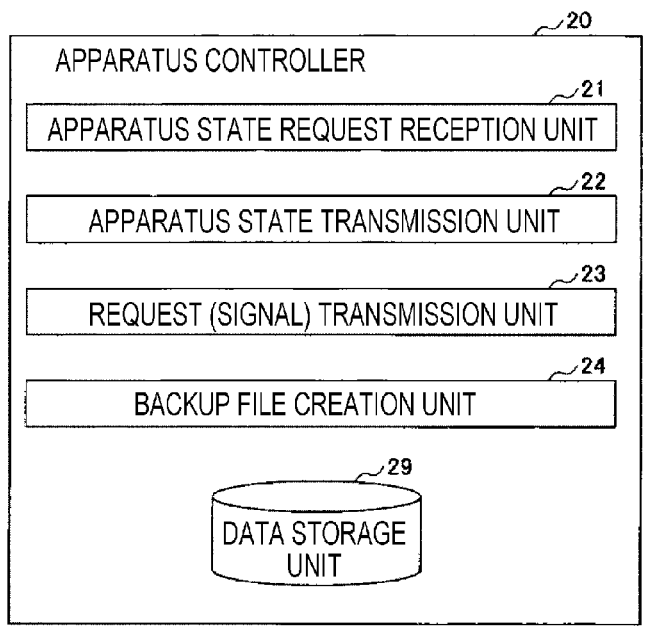
FIG. 6 is a diagram illustrating an example of a functional configuration of the apparatus controller.

The functional configuration of the apparatus controller 20 will be described. FIG. 6 is a diagram illustrating an example of a functional configuration of the apparatus controller 20.

The apparatus controller 20 includes an apparatus state request reception unit 21, an apparatus state transmission unit 22, a request (signal) reception unit 23, a backup file creation unit 24, and a data storage unit 29.

The apparatus state request reception unit 21 receives an apparatus state request transmitted from the server device 10.

Upon receiving the apparatus state request transmitted from the server device 10, the apparatus state transmission unit 22 transmits the apparatus state information at the time of receiving the apparatus state request to the server device 10.

The request (signal) reception unit 23 receives a backup file creation request (signal) transmitted from the server device 10.

Upon receiving the backup file creation request (signal) transmitted from the server device 10, the backup file creation unit 24 creates a backup file based on the backup file creation request (signal). In addition, the backup file creation unit 24 stores the created backup file in the data storage unit 29.

The data storage unit 29 stores the backup file.

(Backup Processing)

Figure 7:
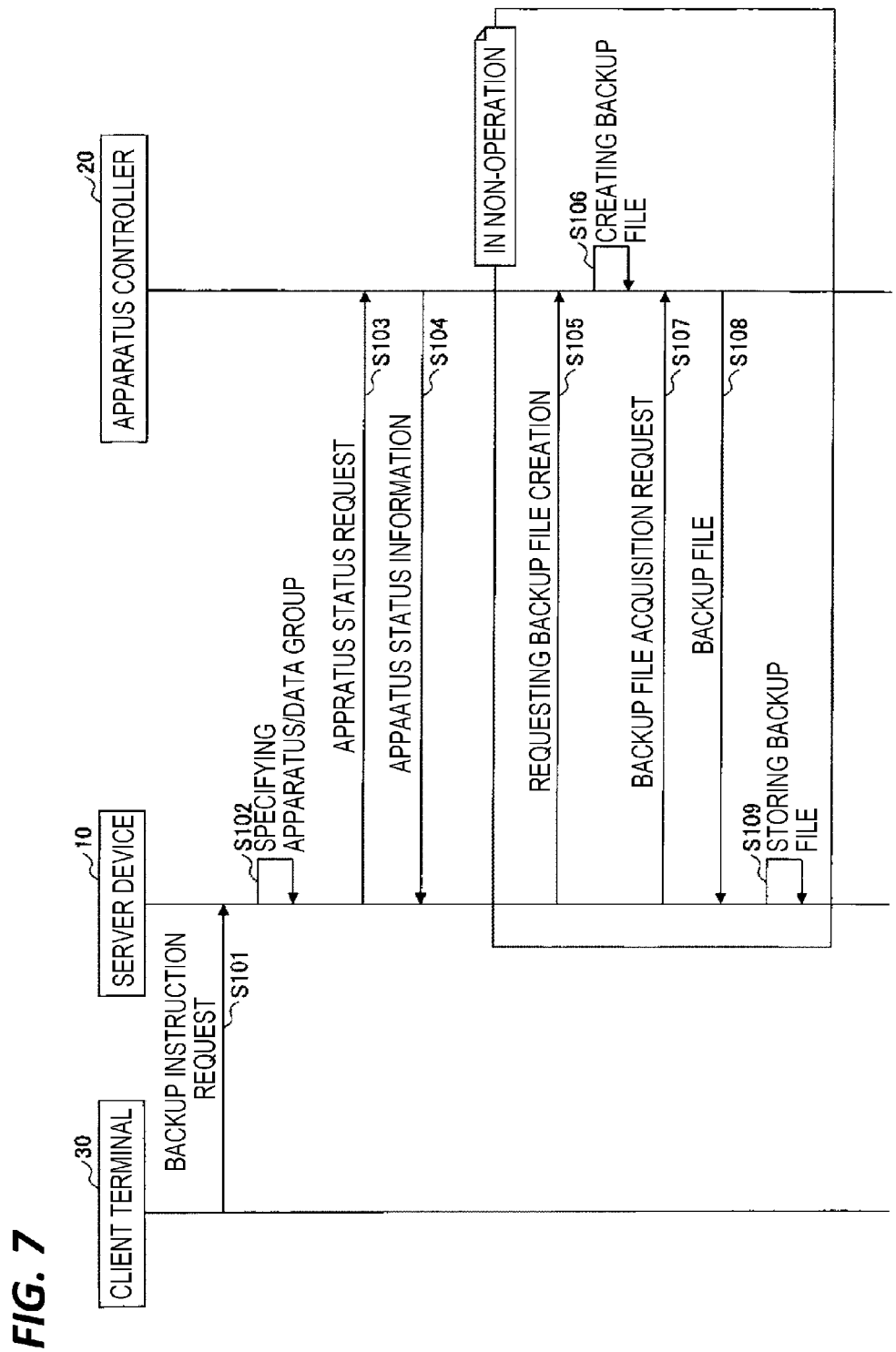
FIG. 7 is a diagram illustrating an example of a flow of a backup processing.

An example of a flow of processing for executing backup of data (hereinafter referred to as "backup processing") specific to a semiconductor manufacturing apparatus in the semiconductor manufacturing system 1 according to the first embodiment will be described. FIG. 7 is a diagram illustrating an example of a flow of a backup processing.

First, when the client terminal 30 receives an operation of a backup instruction by an operator, the client terminal 30 transmits a backup instruction request to the server device 10 (step S101).

When the backup request reception unit 11 receives the backup instruction request from the client terminal 30, the specifying unit 12 specifies a semiconductor manufacturing apparatus and data on which backup is to be executed based on the received backup instruction request (step S102).

When the specifying unit 12 specifies a semiconductor manufacturing apparatus and data on which backup is to be executed, the apparatus state acquisition unit 13 transmits an apparatus state request indicating that the apparatus state of the semiconductor manufacturing apparatus specified by the specifying unit 12 is acquired to the apparatus controller 20 of the semiconductor manufacturing apparatus specified by the specifying unit 12 (step S103).

When the apparatus state request reception unit 21 receives the apparatus state request from the server device 10, the apparatus state transmission unit 22 transmits the apparatus state information at the time when the apparatus state request reception unit 21 received the apparatus state request to the server device 10 (step S104).

When the apparatus state acquisition unit 13 receives the apparatus state information from the apparatus controller 20 and the received apparatus state information is "in non-operation," the request (signal) transmission unit 14 transmits a backup file creation request (signal) requesting creation of a backup file of data specified by the specifying unit 12 to the apparatus controller 20 of the semiconductor manufacturing apparatus specified by the specifying unit 12 (step S105). Meanwhile, when the apparatus state information is "in operation," no processing is performed.

When the request (signal) reception unit 23 receives the backup file creation request (signal) from the server device 10, the backup file creation unit 24 creates a backup file based on the backup file creation request (signal) (step S106).

Subsequently, the request (signal) transmission unit 14 transmits a backup file acquisition request (signal) indicating that backup file acquisition is requested to the apparatus controller 20 of the semiconductor manufacturing apparatus that has transmitted the backup file creation request (signal) (step S107) and acquires a backup file (step S108).

Upon receiving the backup file from the apparatus controller 20, the backup file acquisition and reception unit 15 stores the received backup file in the data storage unit 19 (step S109), and terminates the processing.

According to the first embodiment described above, the following effects are achieved.

According to the first embodiment, the request (signal) transmission unit 14 of the server device 10 transmits a backup file creation request (signal) requesting the apparatus controller 20 to create a backup file of data specific to the semiconductor manufacturing apparatus. In addition, in the apparatus controller 20, the backup file is created by the backup file creation unit 24, and the created backup file is transmitted to the server device 10. In this manner, since the server device 10 acquires the backup file from the apparatus controller 20, even if the storage device of the apparatus controller 20 is damaged, the restoration may be performed using the back file acquired by the server device 10. Therefore, it is possible to restore the semiconductor manufacturing apparatus in a short time and minimize the influence on the production.

In addition, according to the first embodiment, when the apparatus state acquisition unit 13 of the server device 10 acquires the apparatus state from the apparatus controller 20 and the acquired apparatus state is in non-operation, the request (signal) transmission unit 14 of the server device 10 transmits a backup file creation request (signal) to the apparatus controller 20. Then, the apparatus controller 20 creates a backup file when the semiconductor manufacturing apparatus is in non-operation. Since the creation of the backup file is not executed when the semiconductor manufacturing apparatus is in operation in this way, it is possible to suppress the influence on the semiconductor manufacturing process which is being executed by the semiconductor manufacturing apparatus.

Further, according to the first embodiment, the specifying unit 12 of the server device 10 specifies a semiconductor manufacturing apparatus on which a backup processing is executed based on the backup request received by the backup request reception unit 11. Thus, even when the semiconductor manufacturing system has a plurality of semiconductor manufacturing apparatuses, it is possible to create a backup file of data by specifying a desired semiconductor manufacturing apparatus. In addition, it is possible to unitarily manage data of a plurality of semiconductor manufacturing apparatuses with one apparatus controller 20.

Second Embodiment

In the first embodiment, it has been described that when the client terminal accepts the operation of the backup instruction by the operator, the server device executes the backup processing. However, when the backup processing is performed based on the operation of the backup instruction by the operator, it is necessary to be conscious of the timing at which the operator performs the backup processing. Therefore, in the second embodiment, when the communication state between the apparatus controller and the customer host is changed, the server device executes the backup processing.

Hereinafter, the second embodiment will be described focusing on differences from the first embodiment. In addition, the same elements as those of the first embodiment described above will be denoted by the same reference numerals, and a description thereof will be omitted.

(Functional Configuration of Server Device)

Figure 8:
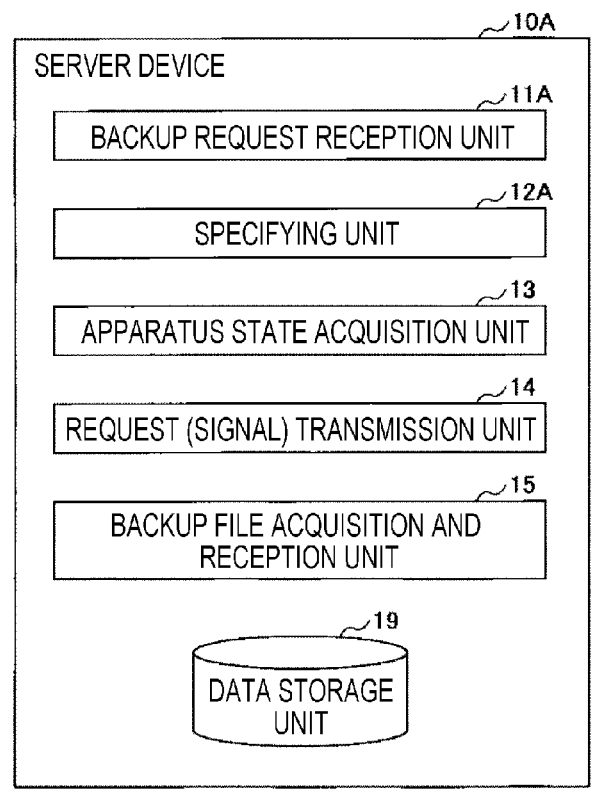
FIG. 8 is a diagram illustrating an example of a functional configuration of a server device according to a second embodiment.

A functional configuration of the server device will be described. FIG. 8 is a diagram illustrating an example of the functional configuration of the server device according to the second embodiment.

A server device 10A is different from the server device 10 of the first embodiment described above with reference to FIG. 3 in that the backup request reception unit 11 is replaced by a backup request reception unit 11A and the specifying unit 12 is replaced by a specifying unit 12A.

The backup request receiving unit 11A receives a communication state change signal when a communication state between the apparatus controller 20A and the customer host 40 is changed.

When the backup request reception unit 11A receives the communication state change signal, the specifying unit 12A specifies the semiconductor manufacturing apparatus controlled by the apparatus controller 20A that has transmitted the communication state change signal as a semiconductor manufacturing apparatus on which a backup is to be executed. In addition, the specifying unit 12A specifies the data on which a backup processing is executed based on the specified semiconductor manufacturing apparatus and the backup setting information stored in the data storage unit 19. The backup setting information includes, for example, information for specifying data for executing backup processing for each semiconductor manufacturing apparatus. The backup setting information is stored in advance in the data storage unit 19 from the client terminal. The backup setting information may be stored in a data storage unit provided separately from the data storage unit 19 of the server device 10A.

(Functional Configuration of Apparatus Controller)

Figure 9:
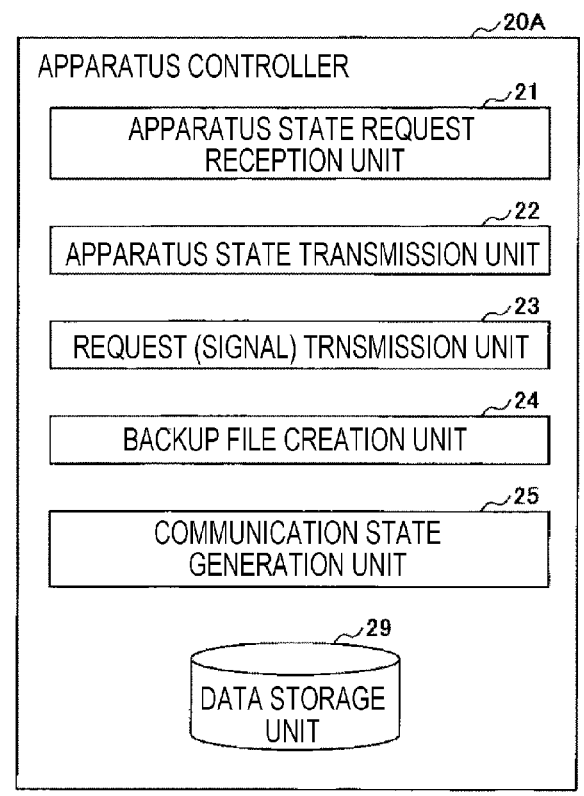
FIG. 9 is a diagram illustrating an example of a functional configuration of an apparatus controller according to the second embodiment.

A functional configuration of the apparatus controller will be described. FIG. 9 is a diagram illustrating an example of a functional configuration of the apparatus controller according to the second embodiment.

The apparatus controller 20A is different from the apparatus controller 20 of the above-described first embodiment described with reference to FIG. 6 in that the apparatus controller 20A further includes a communication state generation unit 25.

When the communication state between the apparatus controller 20A and the customer host 40 is changed, the communication state generation unit 25 generates a communication state change signal and transmits the generated communication state change signal to the server device 10A. The communication state change signal includes, for example, a host online signal generated when the communication state between the apparatus controller 20A and the customer host 40 transits from offline to online, and a host offline signal generated when the communication state between the apparatus controller 20A and the customer host 40 transits from online to offline. In addition, the communication state change signal may be a signal that does not distinguish between the host online signal and the host off line signal.

(Backup Processing)

Figure 10:
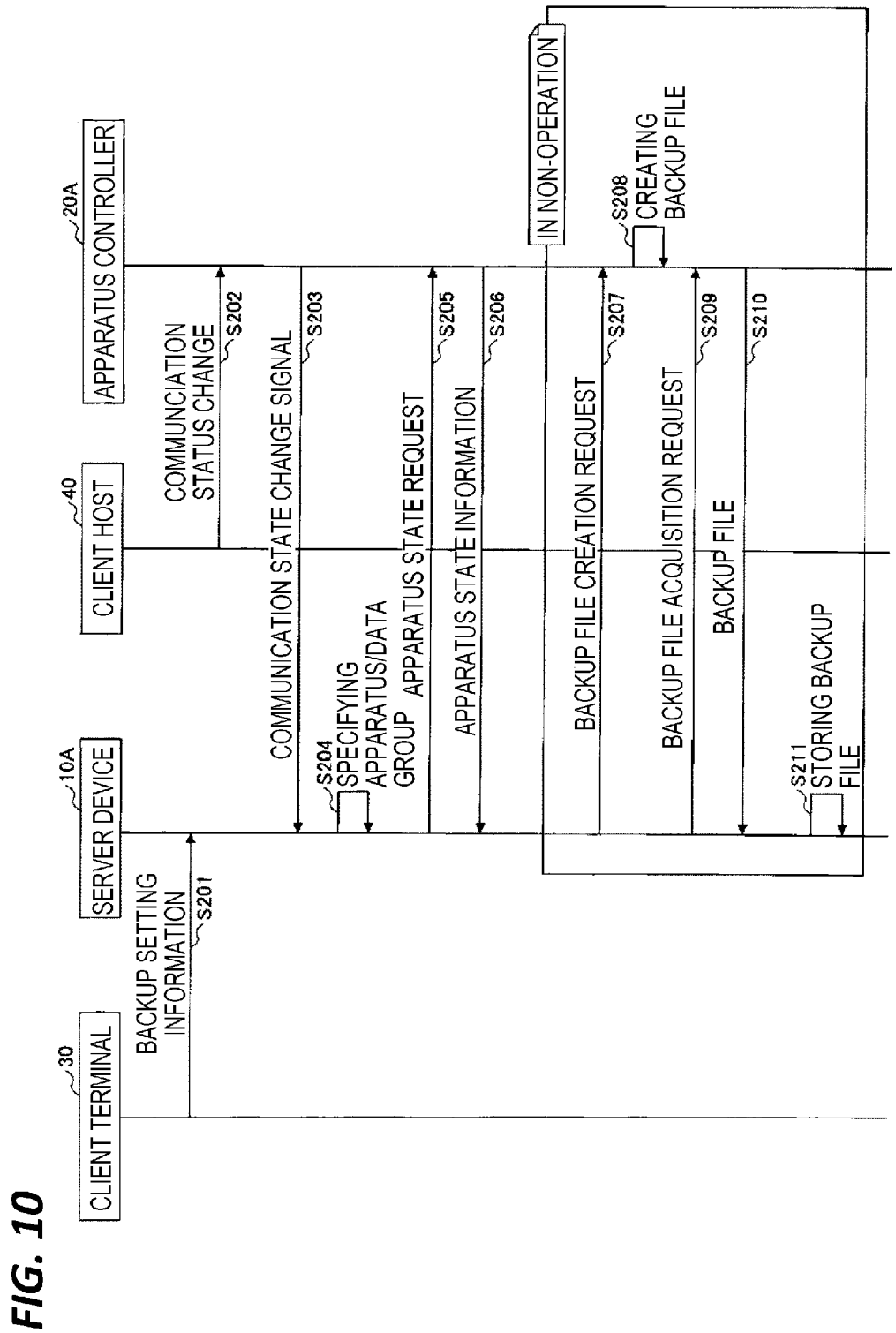
FIG. 10 is a diagram illustrating an example of a flow of a backup processing according to the second embodiment.

An example of a flow of a backup processing according to the second embodiment will be described. FIG. 10 is a diagram illustrating an example of the flow of the backup processing according to the second embodiment.

First, backup setting information is stored in the data storage unit 19 of the server device 10A by the client terminal 30 (step S201).

In addition, when the communication state between the apparatus controller 20A and the customer host 40 is changed (step S202), the communication state generation unit 25 of the apparatus controller 20A generates a communication state change signal and transmits the generated communication state change signal to the server device 10A (step S203).

When the backup request reception unit 11A receives the fact that the communication state change signal from the apparatus controller 20A has been transited to host online, the specifying unit 12A specifies the semiconductor manufacturing apparatus controlled by the apparatus controller 20A, which has transmitted the communication state change signal, and specifies the data on which a backup processing is to be executed based on the specified semiconductor manufacturing apparatus and the backup setting information stored in the data storage unit 19 (step S204).

When the specifying unit 12A specifies a semiconductor manufacturing apparatus and data on which backup is to be executed, the apparatus state acquisition unit 13 transmits an apparatus state request indicating that the apparatus state of the semiconductor manufacturing apparatus specified by the specifying unit 12A is acquired to the apparatus controller 20A of the semiconductor manufacturing apparatus specified by the specifying unit 12A (step S205).

When the apparatus state request reception unit 21 receives the apparatus state request from the server device 10A, the apparatus state transmission unit 22 transmits the apparatus state information at the time when the apparatus state request reception unit 21 received the apparatus state request to the server device 10A (step S206).

When the apparatus state acquisition unit 13 receives the apparatus state information from the apparatus controller 20A and the apparatus state information is "in non-operation," the request (signal) transmission unit 14 transmits a backup file creation request (signal) requesting creation of a backup file of data specified by the specifying unit 12A to the apparatus controller 20A of the semiconductor manufacturing apparatus specified by the specifying unit 12A (step S207). Meanwhile, when the apparatus state information is "in operation," no processing is performed.

When the request (signal) reception unit 23 receives the backup file creation request (signal) from the server device 10A, the backup file creation unit 24 creates a backup file based on the backup file creation request (signal) (step S208).

Subsequently, the request (signal) transmission unit 14 transmits a backup file acquisition request (signal) indicating that backup file acquisition is requested to the apparatus controller 20A of the semiconductor manufacturing apparatus that has transmitted the backup file creation request (signal) (step S209) and acquires a backup file (step S210).

Upon receiving the backup file from the apparatus controller 20A, the backup file acquisition and reception unit 15 stores the received backup file in the data storage unit 19 (step S211), and terminates the processing.

According to the second embodiment described above, the following effect is achieved in addition to the same effect as the effect achieved by the above-described first embodiment.

According to the second embodiment, when the server device 10A receives a host online transition signal transmitted from the apparatus controller 20A, the request (signal) transmission unit 14 of the server device 10A transmits a backup file creation request (signal) to the apparatus controller 20A. As a result, a backup processing can be automatically executed even if the operator is not conscious of the timing at which the backup processing is executed.

Third Embodiment

In the second embodiment, it has been described that, when the communication state between the apparatus controller and the customer host is changed, the server device executes the backup processing. However, the communication state between the apparatus controller and the customer host may not be switched over a long period of time. Therefore, in the third embodiment, the server device executes the backup processing based on a predetermined timing.

Hereinafter, the third embodiment will be described focusing on differences from the first embodiment. In addition, the same elements as those of the first embodiment described above will be denoted by the same reference numerals, and a description thereof will be omitted.

(Functional Configuration of Server Device)

Figure 11:
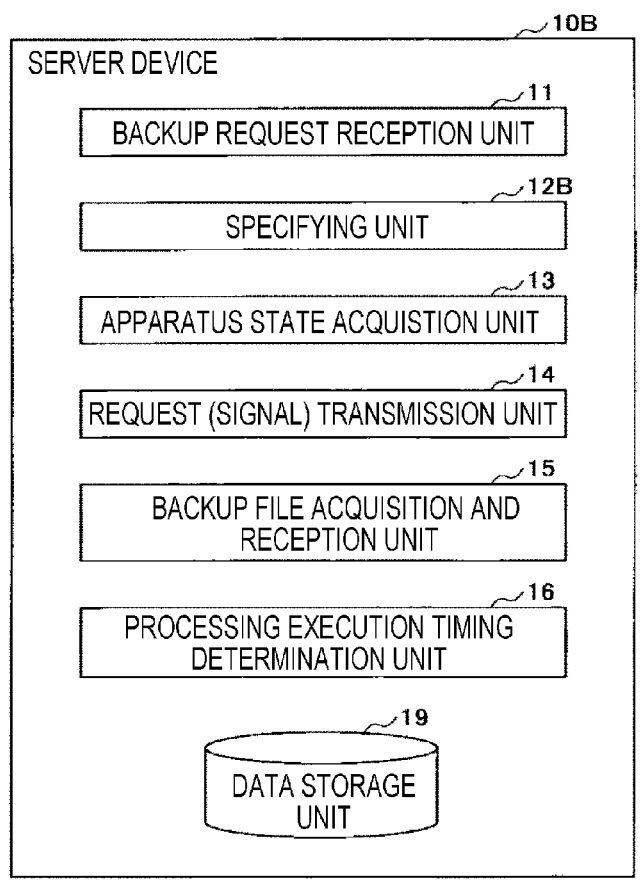
FIG. 11 is a diagram illustrating an example of a functional configuration of a server device according to a third embodiment.

A functional configuration of the server device will be described. FIG. 11 is a diagram illustrating an example of a functional configuration of a server device according to a third embodiment.

The server device 10B is different from the server device 10 of the first embodiment described above with reference to FIG. 3 in that the specifying unit 12 is replaced by the specifying unit 12B and further includes a process execution timing determination unit 16.

The specifying unit 12B specifies a semiconductor manufacturing apparatus and data on which a backup processing is to be executed by identifying backup setting including information specifying a semiconductor manufacturing apparatus and data on which a backup processing, which is stored in the data storage unit 19, is to be executed. The backup setting information includes, for example, information for specifying a semiconductor manufacturing apparatus and data on which a backup processing is to be executed. The backup setting information is stored in advance in the data storage unit 19 from the client terminal. The backup setting information may be stored in a data storage unit provided separately from the data storage unit 19 of the server device.

When the specifying unit 12B specifies the semiconductor manufacturing apparatus and data on which the backup processing is to be executed, a processing execution timing determination unit 16 determines whether or not the current time reaches a set time. The current time may be, for example, the time acquired by an internal clock of the server device 10B. The set time may be, for example, a time every day, a time every week, or a time every month, and is stored in a data storage unit provided separately from the data storage unit 19.

[Backup Processing]

Figure 12:
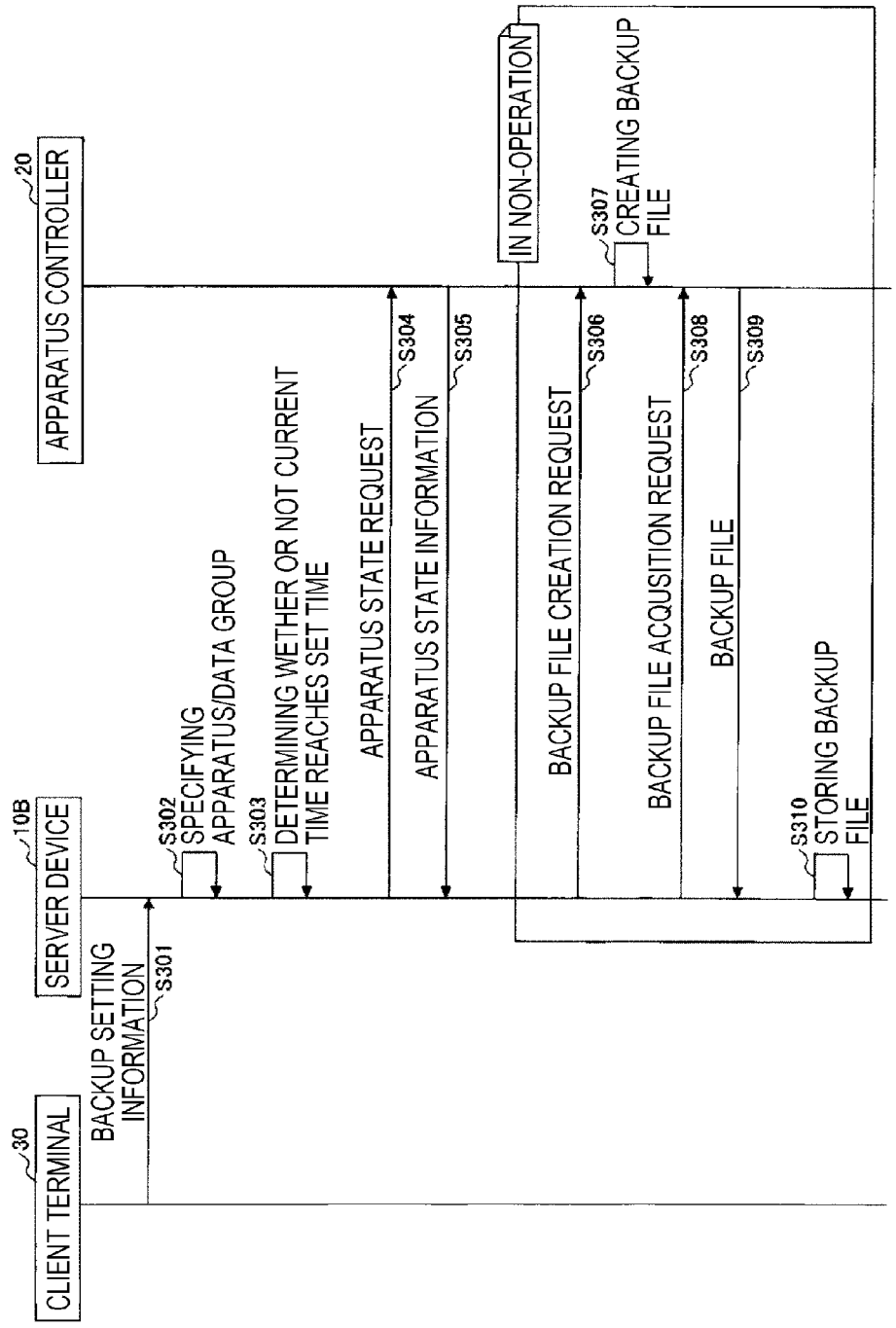
FIG. 12 is a diagram illustrating an example of a flow of a backup processing according to the third embodiment.

An example of a flow of a backup processing according to the third embodiment will be described. FIG. 12 is a diagram illustrating an example of the flow of the backup processing according to the third embodiment.

First, backup setting information is stored in the data storage unit 19 of the server device 10B by the client terminal 30 (step S301).

When the backup setting information is stored in the data storage unit 19, the specifying unit 12B identifies the backup setting stored in the data storage unit 19 and specifies a semiconductor manufacturing apparatus and data on which a backup processing is to be executed (step S302).

When the specifying unit 12B specifies a semiconductor manufacturing apparatus and data on which backup is to be performed, a processing execution timing determination unit 16 determines whether or not the current time reaches a set time (step S303).

When it is determined that the current time reaches the set time, the apparatus state acquisition unit 13 transmits an apparatus state request indicating that the apparatus state of the semiconductor manufacturing apparatus specified by the specifying unit 12B is acquired to the apparatus controller 20 of the semiconductor manufacturing apparatus specified by the specifying unit 12B (step S304). Meanwhile, when the processing execution timing determination unit 16 determines that the current time does not reach the set time, step S303 is repeated.

When the apparatus state request reception unit 21 receives the apparatus state request from the server device 10B, the apparatus state transmission unit 22 transmits the apparatus state information at the time when the apparatus state request reception unit 21 received the apparatus state request to the server device 10B (step S305).

When the apparatus state acquisition unit 13 receives the apparatus state information from the apparatus controller 20 and the apparatus state information is "in non-operation," the request (signal) transmission unit 14 transmits a backup file creation request (signal) requesting creation of a backup file of data specified by the specifying unit 12B to the apparatus controller 20 of the semiconductor manufacturing apparatus specified by the specifying unit 12B (step S306). Meanwhile, when the apparatus state information is "in operation," no processing is performed.

When the request (signal) reception unit 23 receives the backup file creation request (signal) from the server device 10B, the backup file creation unit 24 creates a backup file based on the backup file creation request (signal) (step S307).

Subsequently, the request (signal) transmission unit 14 transmits a backup file acquisition request (signal) indicating that backup file acquisition is requested to the apparatus controller 20 of the semiconductor manufacturing apparatus that has transmitted the backup file creation request (signal) (step S308) and acquires a backup file (step S309).

Upon receiving the backup file from the apparatus controller 20, the backup file acquisition and reception unit 15 stores the received backup file in the data storage unit 19 (step S310), and terminates the processing.

According to the third embodiment described above, the following effect is achieved in addition to the same effect as the effect achieved by the above-described first embodiment.

According to the third embodiment, when it is determined that the current time reaches the set time, the process execution timing determination unit 16 of the server device determines whether or not the request (signal) transmission unit 14 of the server device requests the backup file creation request (signal) to the apparatus controller. As a result, a backup processing may be automatically executed at a preset timing even if the operator is not conscious of the timing at which the backup processing is executed.

According to the semiconductor manufacturing system disclosed herein, it is possible to restore the control device in a short time when the storage device of the control device for controlling a semiconductor manufacturing apparatus is damaged.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor manufacturing system comprising:
a semiconductor manufacturing apparatus including a controller that controls an overall operation of the semiconductor manufacturing apparatus; and
a server configured to bidirectionally communicate with the controller via a communication line,
wherein the server includes a first processor configured to:
transmit to the controller a backup file creation request that sets data specific to the controller as a backup file and transmit to the controller a backup file acquisition request requesting acquisition of the created backup file; and
receive the created backup file from the controller, and
wherein the controller includes a second processor configured to:
receive the backup file creation request and the backup file acquisition request from the server; and
create the backup file when receiving the backup file creation request from the server,
wherein the first processor of the server transmits the backup file creation request to the controller according to an apparatus state of the semiconductor manufacturing apparatus transmitted from the second processor of the controller such that the controller of the semiconductor manufacturing apparatus creates the backup file when the apparatus state of the semiconductor manufacturing apparatus is a non-operating state.

2. The semiconductor manufacturing system of claim 1, wherein the semiconductor manufacturing apparatus includes a plurality of semiconductor manufacturing apparatuses each including a controller that controls an overall operation of each of the semiconductor manufacturing apparatuses, and
the first processor of the server is further configured to specify a semiconductor manufacturing apparatus that executes backup of the data.

3. The semiconductor manufacturing system of claim 2, wherein the first processor is configured to specify the semiconductor manufacturing apparatus that executes the backup of the data based on information transmitted from a client terminal connected to the server via a communication line.

4. The semiconductor manufacturing system of claim 3, wherein the first processor of the server is further configured to transmit an apparatus state request indicating that the apparatus state of the specified semiconductor manufacturing apparatus is acquired to the controller of the specified semiconductor manufacturing apparatus specified by the specifying unit, and
the second processor of the controller is further configured to:
receive the apparatus state request transmitted from the server; and
transmit the apparatus state at a time of receiving the apparatus state request when the second processor receives the apparatus state request.

5. The semiconductor manufacturing system of claim 4, wherein the first processor of the server is further configured to determine whether or not a current time reaches a set time when the first processor specifies an apparatus and data on which backup is to be executed, and
when the first processor determines that the current time reaches the set time, the first processor transmits the apparatus state request to the specified controller of the semiconductor manufacturing apparatus.

6. The semiconductor manufacturing system of claim 2, wherein the first processor is configured to specify the semiconductor manufacturing apparatus that executes the backup of the data based on information transmitted from the controller.

7. The semiconductor manufacturing system of claim 6, wherein the information transmitted from the second processor of the controller is a signal generated when a communication state between the controller and a customer host is changed.

8. The semiconductor manufacturing system of claim 2, wherein the first processor of the server is further configured to transmit an apparatus state request indicating that the apparatus state of the specified semiconductor manufacturing apparatus is acquired to the controller of the specified semiconductor manufacturing apparatus, and
the second processor of the controller is further configured to:
receive the apparatus state request transmitted from the server; and
transmit the apparatus state at a time of receiving the apparatus state request when the second processor receives the apparatus state request.

9. The semiconductor manufacturing system of claim 8, wherein the first processor of the server is further configured to determine whether or not a current time reaches a set time when the first processor specifies an apparatus and data on which backup is to be executed, and when the first processor determines that the current time reaches the set time, the first processor transmits the apparatus state request to the controller of the specified semiconductor manufacturing apparatus.

10. A server that bidirectionally communicates with a controller configured to control a semiconductor manufacturing apparatus, the server comprising a processor configured to:
transmit to the controller a backup file creation request that sets data specific to the controller as a backup file and transmit to the controller a backup file acquisition request requesting acquisition of the created backup file; and
receive the created backup file from the controller,
wherein the processor of the server transmits the backup file creation request to the controller according to an apparatus state of the semiconductor manufacturing apparatus transmitted from the controller such that the controller of the semiconductor manufacturing apparatus creates the backup file when the apparatus state of the semiconductor manufacturing is a non-operating state.

11. A semiconductor manufacturing system comprising:
a plurality of semiconductor manufacturing apparatuses each including a controller that controls an overall operation of each of the semiconductor manufacturing apparatuses; and
a server configured to bidirectionally communicate with the controller via a communication line,
wherein the server includes a first processor configured to:
transmit to the controller a backup file creation request that sets data specific to the controller as a backup file and transmit to the controller a backup file acquisition request requesting acquisition of the created backup file; and
receive the created backup file from the controller,
wherein the controller includes a second processor configured to:
receive the backup file creation request and the backup file acquisition request from the server; and
create the backup file when receiving the backup file creation request from the server, and
wherein the first processor of the server is configured to specify a semiconductor manufacturing apparatus that executes backup of the data based on a signal generated when a communication state between the controller and a customer host is changed between online and offline.

12. The semiconductor manufacturing system of claim 11, wherein the first processor of the server transmits the backup file creation request to the controller according to an apparatus state of the semiconductor manufacturing apparatus transmitted from the second processor of the controller.

13. The semiconductor manufacturing system of claim 12, wherein the controller creates the backup file when the apparatus state of the semiconductor manufacturing apparatus is a non-operating state.

* * * * *